(12) United States Patent
Wang et al.

(10) Patent No.: US 12,325,629 B2
(45) Date of Patent: Jun. 10, 2025

(54) NANOSTRUCTURE TRANSFER METHOD

(71) Applicants: THALES SOLUTIONS ASIA PTE LTD, Singapore (SG); CENTRE NATIONAL DE LA RECHERCHE SCIENTIFIQUE, Paris (FR); NANYANG TECHNOLOGICAL UNIVERSITY, Singapore (SG); UNIVERSITÉ DE LILLE, Lille (FR)

(72) Inventors: Jianxiong Wang, Singapore (SG); Philippe Coquet, Singapore (SG); Beng Kang Tay, Singapore (SG)

(73) Assignees: Thales Solutions Asia PTE LTD, Singapore (SG); Centre National De La Recherche Scientifique, Paris (FR); Nanyang Technological University, Singapore (SG); Université De Lille, Lille (FR)

( * ) Notice: Subject to any disclaimer, the term of this patent is extended or adjusted under 35 U.S.C. 154(b) by 621 days.

(21) Appl. No.: 17/270,915

(22) PCT Filed: Aug. 29, 2019

(86) PCT No.: PCT/SG2019/050427
§ 371 (c)(1),
(2) Date: Feb. 24, 2021

(87) PCT Pub. No.: WO2020/046208
PCT Pub. Date: Mar. 5, 2020

(65) Prior Publication Data
US 2021/0214215 A1 Jul. 15, 2021

(30) Foreign Application Priority Data
Aug. 29, 2018 (SG) .............................. 10201807403V

(51) Int. Cl.
*B81C 1/00* (2006.01)
*B82Y 40/00* (2011.01)
(Continued)

(52) U.S. Cl.
CPC ...... *B81C 1/00031* (2013.01); *B81C 1/00111* (2013.01); *H10K 71/18* (2023.02); *H10K 85/221* (2023.02); *B82Y 40/00* (2013.01)

(58) Field of Classification Search
CPC ............ B81C 1/00031; B81C 1/00111; H01L 21/6835
See application file for complete search history.

(56) References Cited

U.S. PATENT DOCUMENTS 6,340,822 B1 * 1/2002 Brown .............. H01L 23/53276
257/E23.068
7,402,531 B1 * 7/2008 Kuekes ................. C30B 11/006
438/755
(Continued)

OTHER PUBLICATIONS

Huang, Z.P., Wu, J.W., Ren, Z.F., Wang, J.H., Siegal, M.P., and Provencio, P.N., "Growth of highly oriented carbon nanotubes by plasma-enhanced hot filament chemical vapor deposition," Applied Physics Letters, 1998. 73(26): p. 3845-3847.
(Continued)

*Primary Examiner* — Matthew L Reames
(74) *Attorney, Agent, or Firm* — Dinsmore & Shohl LLP

(57) ABSTRACT

A nanostructure transfer method is provided. The method includes providing a first substrate (10) having thereon a plurality of nanostructures (12), the nanostructures (12) extending away from the first substrate (10). A solder material (14) is deposited on distal ends of the nanostructures (12). A second substrate (18) having thereon a first metal layer (20) is provided. The solder material (14) is bonded to the first metal layer (20), thereby attaching the
(Continued)

nanostructures (12) to the second substrate (18). The attached nanostructures (12) are then released from the first substrate (10).

22 Claims, 11 Drawing Sheets

(51) Int. Cl.
  *H10K 71/18* (2023.01)
  *H10K 85/20* (2023.01)

(56) References Cited

U.S. PATENT DOCUMENTS

| | | | |
|---|---|---|---|
| 2003/0027415 | A1 | 2/2003 | Heinen |
| 2005/0064185 | A1* | 3/2005 | Buretea ............... H01L 29/0673 428/364 |
| 2007/0128883 | A1 | 6/2007 | Hwang |
| 2008/0088034 | A1 | 4/2008 | Kuwabara et al. |
| 2009/0246507 | A1 | 10/2009 | Graham, Jr. et al. |
| 2010/0078799 | A1 | 4/2010 | Zarbock et al. |
| 2017/0373046 | A1 | 12/2017 | Gardner et al. |

OTHER PUBLICATIONS

Lee, C.J., Kim, D.W., Lee, T.J., Choi, Y.C., Park, Y.S., Lee, Y.H., Choi, W.B., Lee, N.S., Park, G.S., and Kim, J.M., "Synthesis of aligned carbon nanotubes using thermal chemical vapor deposition. Chemical Physics Letters," 1999. 312(5-6): p. 461-468.

Liu, Y.M. and Chuang, T.H., "Interfacial reactions between liquid indium and Au-deposited substrates," Journal of Electronic Materials, 2000. 29(4): p. 405-410.

Wei, B.Q., Vajtai, R., and Ajayan, P.M., "Reliability and current carrying capacity of carbon nanotubes," Applied Physics Letters, 2001. 79(8): p. 1172-1174.

Dai, H.J., "Carbon nanotubes: opportunities and challenges," Surface Science, 2002. 500(1-3): p. 218-241.

Kato, T., Jeong, G.H., Hirata, T., Hatakeyama, R., Tohji, K., and Motomiya, K., "Single-walled carbon nanotubes produced by plasma-enhanced chemical vapor deposition. Chemical Physics Letters," 2003. 381(3-4): p. 422-426.

Chung, J.Y., Lee, K.H., Lee, J.H., and Ruoff, R.S., "Toward large-scale integration of carbon nanotubes," Langmuir, 2004. 20(8): p. 3011-3017.

Kumar, A., Pushparaj, V.L., Kar, S., Nalamasu, O., Ajayan, P.M., and Baskaran, R., "Contact transfer of aligned carbon nanotube arrays onto conducting substrates," Applied Physics Letters, 2006. 89(16).

Pop, E., Mann, D., Wang, Q., Goodson, K.E., and Dai, H.J., "Thermal conductance of an individual single-wall carbon nanotube above room temperature," Nano Letters, 2006. 6(1): p. 96-100.

Zhu, L.B., Sun, Y.Y., Hess, D.W., and Wong, C.P., "Well-aligned open-ended carbon nanotube architectures: An approach for device assembly," Nano Letters, 2006. 6(2): p. 243-247.

Jiang, H., Zhu, L., Moon, K.-S., and Wong, C.P., "Low temperature carbon nanotube film transfer via conductive polymer composites," Nanotechnology, 2007. 18(12).

Li, S., Yan, Y., Liu, N., Chan-Park, M.B., and Zhang, Q., "Transfer printing of submicrometer patterns of aligned carbon nanotubes onto functionalized electrode," Aligned Carbon Nanotubes, 2007. 3(4): p. 616-621.

Wang, T., Carlberg, B., Jonsson, M., Jeong, G.-H., Campbell, E.E.B., and Liu, J., "Low temperature transfer and formation of carbon nanotube arrays by imprinted conductive adhesive," Applied Physics Letters, 2007. 91(9).

Ishikawa, F.N., Chang, H.-K., Ryu, K., Chen, P.-C., Badmaev, A., Gomez De Arco, L., Shen, G., and Zhou, C., "Transparent Electronics Based on Transfer Printed Aligned Carbon Nanotubes on Rigid and Flexible Substrates," ACS Nano, 2009. 3(1): p. 73-79.

Johnson, R.D., Bahr, D.F., Richards, C.D., Richards, R.F., Mcclain, D., Green, J., and Jiao, J., "Thermocompression bonding of vertically aligned carbon nanotube turfs to metalized substrates," Nanotechnology, 2009. 20(6).

Li, H., Xu, C., Srivastava, N., and Banerjee, K., "Carbon Nanomaterials for Next-Generation Interconnects and Passives: Physics, Status, and Prospects," IEEE Transactions on Electron Devices, 2009. 56(9): p. 1799-1821.

Esconjauregui, S., Fouquet, M., Bayer, B.C., Ducati, C., Smajda, R., Hofmann, S., and Robertson, J., "Growth of Ultrahigh Density Vertically Aligned Carbon Nanotube Forests for Interconnects. Acs Nano", 2010. 4(12): p. 7431-7436.

Fu, Y.F., Qin, Y.H., Wang, T., Chen, S., and Liu, J.H., "Ultrafast Transfer of Metal-Enhanced Carbon Nanotubes at Low Temperature for Large-Scale Electronics Assembly," Advanced Materials, 2010. 22(44): p. 5039.

Gross, A.F.C., W. B., "Metal bonded nanotube array," US patent, 2010. 20100190023.

Hamdan, A., Cho, J., Johnson, R., Jiao, J., Bahr, D., Richards, R., and Richards, C., "Evaluation of a thermal interface material fabricated using thermocompression bonding of carbon nanotube turf," Nanotechnology, 2010. 21(1).

Li, H., Xu, C.A., and Banerjee, K., "Carbon Nanomaterials: The Ideal Interconnect Technology for Next-Generation ICs," IEEE Design & Test of Computers, 2010. 27(4): p. 20-31.

Ionescu, A.M., Dijon, J., and Robertson, J., "Integration for All Configurations. IEEE Microwave Magazine," 2011. 12(7): p. 42-50.

Rohwer, L.E.S., Chu, D., "Thin Gold to Gold Bonding for Flip Chip Applications," 2011 IEEE 61st Electronic Components and Technology Conference. 2011. p. 907-910.

Brun, C., Franck, P., Coquet, P., Baillargeat, D., Tay, B.K., "Monopole Antenna based on Carbon Nanotubes," in 2013 IEEE Mtt-S International Microwave Symposium Digest. 2013.

De Volder, M., Park, S., Tawfick, S., and Hart, A.J., "Strain-engineered manufacturing of freeform carbon nanotube microstructures," Nat Commun, 2014. 5: p. 4512.

International Search Report and Written Opinion mailed Nov. 18, 2019 in related International Application No. PCT/SG2019/050427.

Meitl, M.A., Zhou, Y.X., Gaur, A., Jeon, S., Usrey, M.L., Strano, M.S., and Rogers, J.A., "Solution casting and transfer printing single-walled carbon nanotube films," Nano Letters, 2004. 4(9): p. 1643-1647.

Burda, M., Lekawa-Raus, A., Gruszczyk, A., and Koziol, K.K.K., "Soldering of Carbon Materials Using Transition Metal Rich Alloys," Acs Nano, 2015. 9(8): p. 8099-8107.

Chhowalla, M., Teo, K.B.K., Ducati, C., Rupesinghe, N.L., Amaratunga, G.A.J., Ferrari, A.C., Roy, D., Robertson, J., and Milne, W.I., "Growth process conditions of vertically aligned carbon nanotubes using plasma enhanced chemical vapor deposition," Journal of Applied Physics, 2001. 90(10): p. 5308-5317.

International Search Report and Written Opinion pertaining to PCT/SG2019/050427.

European Office Action, mailed on Nov. 23, 2023, in reference to European Application No. 19765823.0.

* cited by examiner

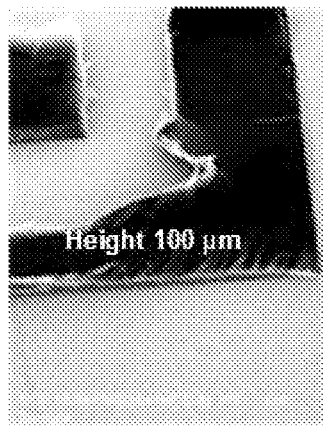
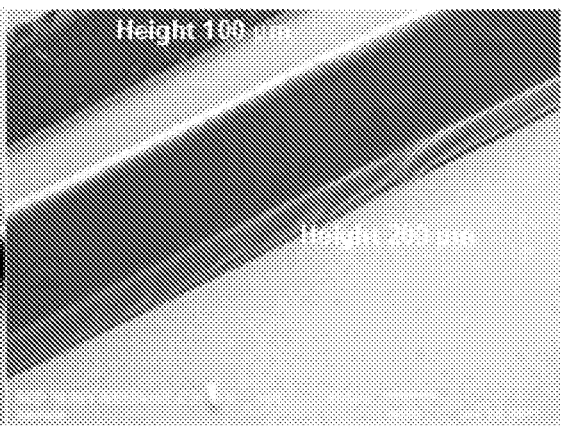
FIG. 11A    FIG. 11B
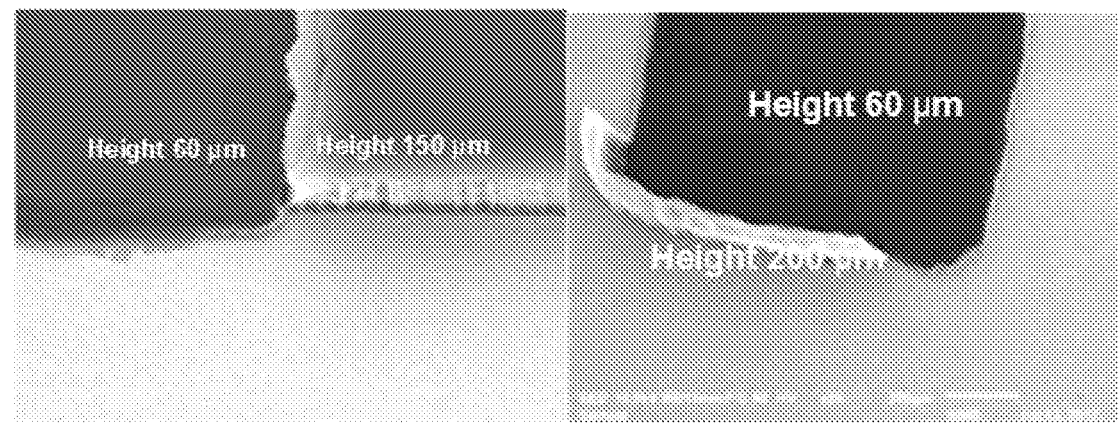
FIG. 11C    FIG. 11D
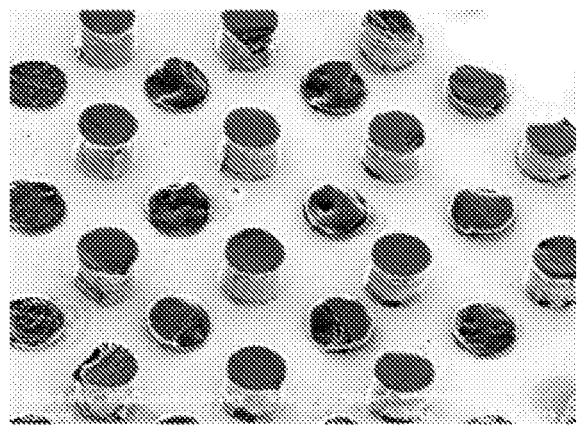
FIG. 11E

NANOSTRUCTURE TRANSFER METHOD

CROSS REFERENCES TO RELATED APPLICATIONS

This application is a national-stage application under 35 U.S.C. § 371 of International Application No. PCT/SG2019/050427, filed Aug. 29, 2019, which international application claims the benefit of priority to Singapore Patent Application No. 10201807403V, filed Aug. 29, 2018.

FIELD OF THE INVENTION

The present invention relates to the field of microelectronics and more particularly to a nanostructure transfer method.

BACKGROUND OF THE INVENTION

High frequency devices and packaging are gaining interest due to increasing demand for mobile, wireless and satellite communications. As such applications require operation at much higher frequencies with high data rates and reduced scaling, the increasing demand for mobile, wireless and satellite communications poses great challenges to current packaging systems.

In view of the foregoing, it is desirable to provide a simple and reliable nanostructure transfer method.

SUMMARY OF THE INVENTION

Accordingly, in a first aspect, the present invention provides a nanostructure transfer method. The method includes providing a first substrate having thereon a plurality of nanostructures, the nanostructures extending away from the first substrate. A solder material is deposited on distal ends of the nanostructures. A second substrate having thereon a first metal layer is provided. The solder material is bonded to the first metal layer, thereby attaching the nanostructures to the second substrate. The attached nanostructures are then released from the first substrate.

Other aspects and advantages of the invention will become apparent from the following detailed description, taken in conjunction with the accompanying drawings, illustrating by way of example the principles of the invention.

BRIEF DESCRIPTION OF THE DRAWINGS

Embodiments of the invention will now be described, by way of example only, with reference to the accompanying drawings, in which:

FIGS. 11A through 11E are scanning electron microscopy (SEM) images of transferred nanostructures of different heights in accordance with embodiments of the present invention;

DETAILED DESCRIPTION OF EXEMPLARY EMBODIMENTS

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the scope of the invention.

With reference to FIGS. 1A through 4, a nanostructure transfer method will now be described.

Figure 1A:
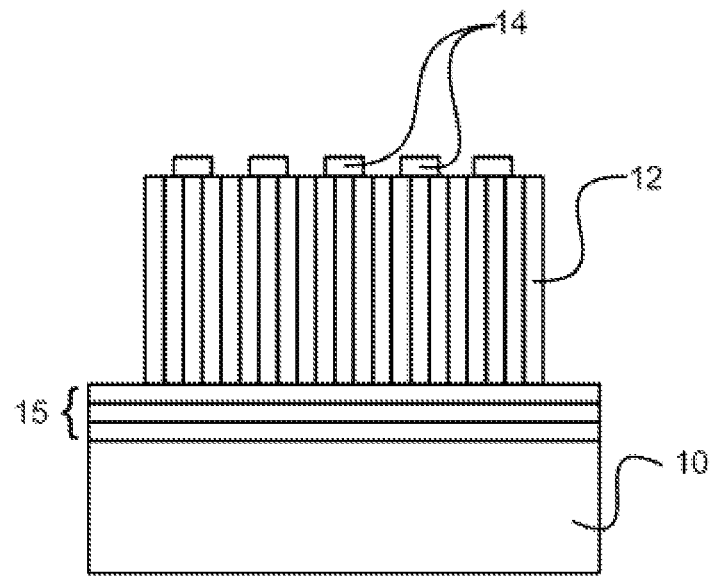
FIG. 1A is a schematic cross-sectional view illustrating a step of depositing a solder material on distal ends of a plurality of nanostructures in accordance with an embodiment of the present invention.

Referring first to FIG. 1A, the nanostructure transfer method begins with provision of a first substrate 10 having thereon a plurality of nanostructures 12, the nanostructures 12 extending away from the first substrate 10. A solder material 14 is deposited on distal ends of the nanostructures 12 as shown.

The first substrate 10 may be a silicon (Si) substrate, a silicon dioxide/silicon (SiO$_2$/Si) substrate or any other substrate that is able to withstand a temperature of above 500° C.

The nanostructures 12 may be vertically aligned carbon nanotube (CNT) structures or any other aligned nanostructures such as, for example, semiconductor oxide nanowires and silicon nanowires. In one embodiment, the nanostructures 12 may be fabricated as a well-aligned CNT forest with high density and a smooth surface using a traditional growth process for CNTs. Such a process may begin with deposition of a catalyst layer 15 on the first substrate 10. In one embodiment, the catalyst layer 15 may be a multi-layer film of iron/aluminium oxide/aluminium (Fe/Al$_2$O$_3$/Al) with a thickness of the 2/2/8 nanometres (nm) deposited on the first substrate 10 by electron beam (e-beam) evaporation. Thereafter, CNTs may be grown on the catalyst layer 15 using a chemical vapour deposition (CVD) system at a temperature range of between about 550 and about 750 degrees Celsius (° C.) to form vertically aligned CNT arrays.

Each of the nanostructures 12 may have a height of between about 10 microns (μm) and about 1 millimetre (mm). In the embodiment described above, the height of the CNT arrays may be controlled by adjusting the growth time.

The solder material 14 may have a melting point that is compatible with complementary metal-oxide-semiconductor (CMOS) and/or integrated circuit (IC) processing temperatures, typically of less than 300 degrees Celsius (° C.). In exemplary embodiments, the solder material 14 may have a melting point of less than 220 degrees Celsius (° C.), and more preferably, less than 200° C. Advantageously, this allows performance of the nanostructure transfer method at low processing temperatures.

In the embodiment shown, the solder material 14 is deposited in a pattern on a surface of the nanostructures 12. Advantageously, this facilitates selective transfer of nanostructure arrays of various shapes and geometries. In one embodiment, the solder material 14 may be deposited in a pattern on the surface of the nanostructures 12 using a hard shadow mask. More particularly, the hard shadow mask is first provided on the surface of the nanostructures 12 before deposition of the solder material 14 and the hard shadow mask is removed thereafter leaving a patterned solder material 14 on the surface of the nanostructures 12. In this manner, a layer of patterned low melting point solder material may thus be applied onto a top surface of the aligned nanostructures 12.

The solder material 14 may be indium (In), tin (Sn), zinc (Zn) or any alloy of one or more of these materials.

The solder material 14 may be deposited to a thickness of between about 200 nanometres (nm) and about 600 nm. The thickness of the solder material 14 may depend on surface roughness of the nanostructures 12.

Figure 1B:
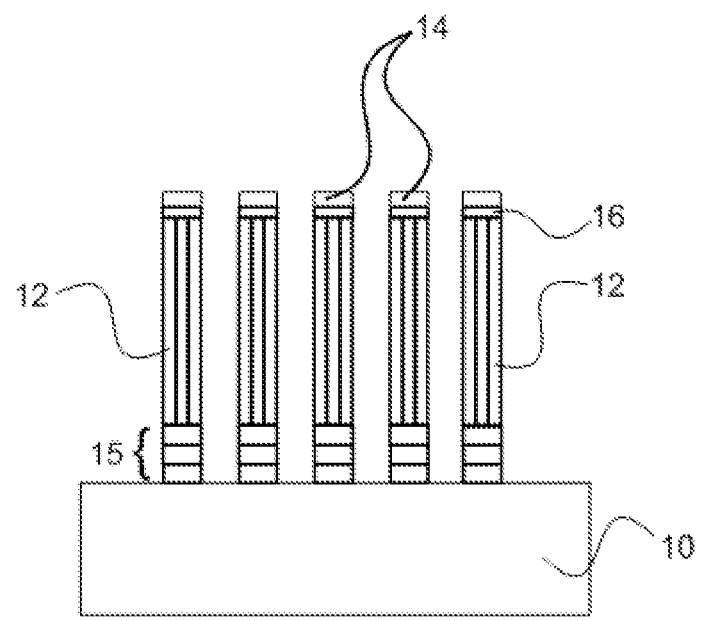
FIG. 1B is a schematic cross-sectional view illustrating a step of depositing a solder material on distal ends of a plurality of nanostructures in accordance with another embodiment of the present invention.

Referring now to FIG. 1B, the nanostructures 12 on the first substrate 10 may be provided in a patterned array in an alternative embodiment as shown.

Both unpatterned and patterned nanostructure arrays may be fabricated using the traditional growth process for CNTs described above. To fabricate patterned CNT arrays, the first substrate 10 may first be patterned with a catalyst using a standard photo-lithography process, following which the CNTs are then grown on the first substrate 10 by CVD. In such an embodiment, the solder material 14 may be directly deposited on the patterned array of the nanostructures 12 without requiring use of the hard shadow mask. Advantageously, this helps to overcome a size limitation posed by the hard shadow mask.

In the present embodiment, a second metal layer 16 may be deposited on the distal ends of the nanostructures 12 prior to depositing the solder material 14 to improve adhesion of the nanostructures 12 to the solder material 14. The second metal layer 16 may be one of titanium (Ti), nickel (Ni), palladium (Pd) and chromium (Cr) and may be deposited to a thickness of between about 5 nanometres (nm) and about 100 nm.

Figure 2A:
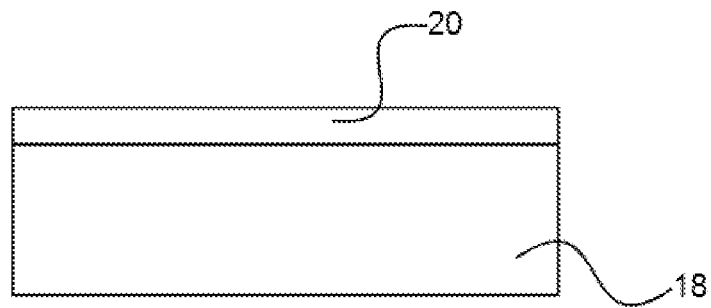
FIG. 2A is a schematic cross-sectional view illustrating a step of providing a substrate having thereon a metal layer in accordance with an embodiment of the present invention.

Referring now to FIG. 2A, a second or target substrate 18 having thereon a first metal layer 20 is provided as shown.

The second or target substrate 18 may be made of any material that is able to resist a melting temperature of the solder material 14 for a subsequent bonding step.

The first metal layer 20 on the second or target substrate 18 may be a metallization layer for a subsequently formed semiconductor device or an additional metal layer specifically for bonding with the solder material 14 on the nanostructures 12.

The first metal layer 20 may have a thickness of between about 50 nm and about 5 μm depending on real requirements of the subsequently formed semiconductor device.

The first metal layer 20 may be gold (Au), silver (Ag) or any other metal or alloy that has good adhesion and wettability with the solder material 14 on the nanostructures 12. When gold is used, the gold layer serves as an adhesive enhanced layer to improve adhesion with the solder material 14.

In the embodiment shown, the first metal layer 20 is unpatterned.

Figure 2B:
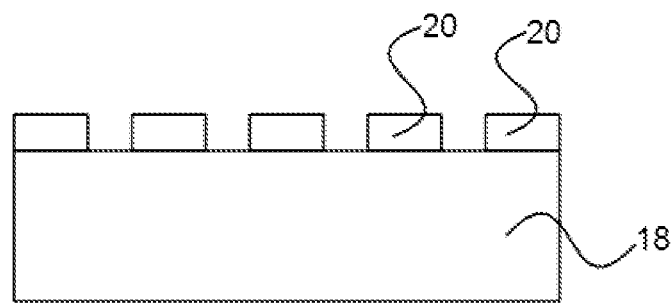
FIG. 2B is a schematic cross-sectional view illustrating a step of providing a substrate having thereon a patterned metal layer in accordance with another embodiment of the present invention.

Referring now to FIG. 2B, the first metal layer may be patterned in an alternative embodiment as shown.

Figure 3:
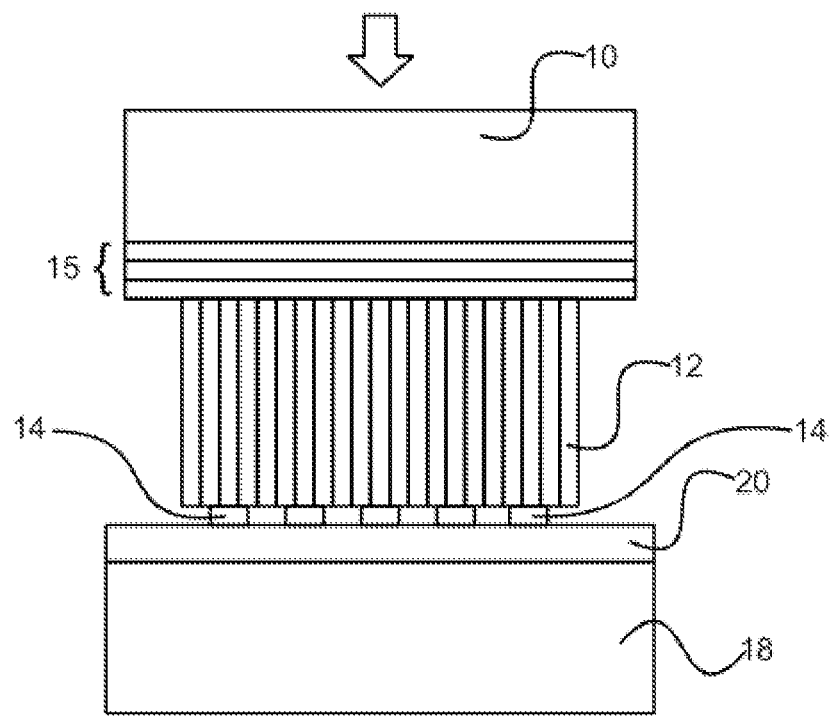
FIG. 3 is a schematic cross-sectional view illustrating a step of bonding the solder material of FIG. 1A to the metal layer of FIG. 2A.

Referring now to FIG. 3, the solder material 14 is bonded to the first metal layer 20 as shown, thereby attaching the nanostructures 12 to the second substrate 18. This may involve melting the solder material 14. In the present embodiment, a force may be applied to bond the solder material 14 to the first metal layer 20.

In one embodiment, the nanostructures 12 may be bonded to the second substrate 18 through use of a flip-chip bonder (not shown). During the bonding process, temperature and pressure may be applied and controlled by the flip-chip bonder. The nanostructures 12 with the solder material 14 deposited thereon and the second substrate 18 may be heated to a temperature higher than the melting point of the solder material 14 such that the solder material 14 melts, then the temperature is maintained for about 1 minute (min) and pressure is applied to bond the nanostructures 12 to the second substrate 18. The latter may be by applying a force across the aligned nanostructures 12, the solder material 14 and the second substrate 18. Advantageously, heating from both the nanostructure side and the target substrate side helps ensure homogenous heating. Subsequently, the nanostructures 12 and the second substrate 18 are cooled to room temperature so that the solder material 14 re-solidifies, adhering the nanostructures 12 to the second substrate 18. The entire bonding process may take about 2 min.

Figure 4:
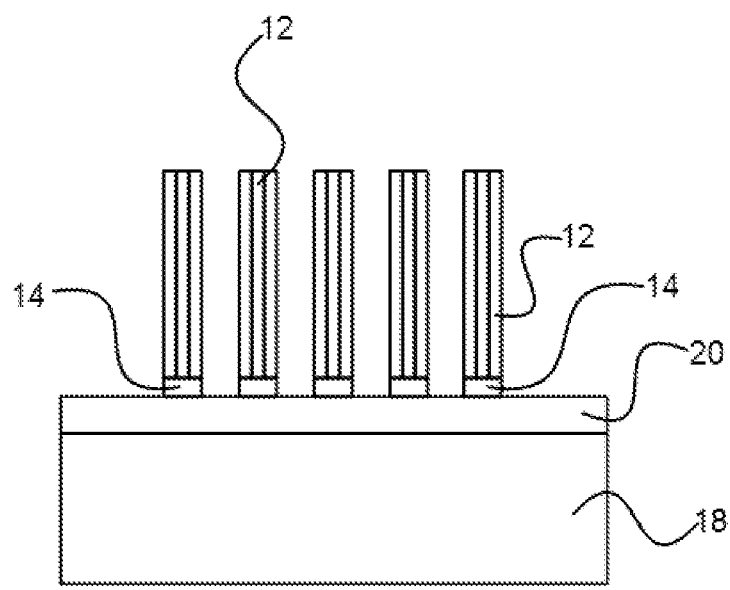
FIG. 4 is a schematic cross-sectional view of nanostructures transferred in accordance with an embodiment of the present invention.

Referring now to FIG. 4, the attached nanostructures 12 are released from the first substrate 10 as shown. This may be by applying a force to mechanically release the second substrate 18 with the nanostructures 12 attached thereon. Due to the good adhesion between the solder material 14 deposited on the nanostructures 12 and the first metal layer 20 on the second or target substrate 18, the nanostructures 12 deposited with the solder material 14 become attached to the first metal layer 20 and are transferred onto the second or target substrate 18, whilst the nanostructures 12 without the solder material 14 do not become attached to the first metal layer 20 at the low transfer temperature. In this manner, the nanostructures 12 may be selectively transferred onto the second or target substrate 18.

The attached nanostructures 12 may have a collective width of between about 5 microns (μm) and about 5 centimetres (cm).

With the described nanostructure transfer method, patterned arrays of nanostructures may be transferred to a target or host substrate with a size range of from 10 μm to several centimetres. A maximum size of the transferred nanostructure arrays may depend on an arm size of the flip-chip bonder and a height of the transferred nanostructures may be varied from between about 10 μm and about 1 mm.

The described nanostructure transfer method is both simple and cost effective. Furthermore, by reducing a metal junction between the nanostructures 12 and the second or target substrate 18 to only a metal/solder 20/14 junction, series resistance is reduced and this is advantageous for performance of high frequency devices.

Figure 5:
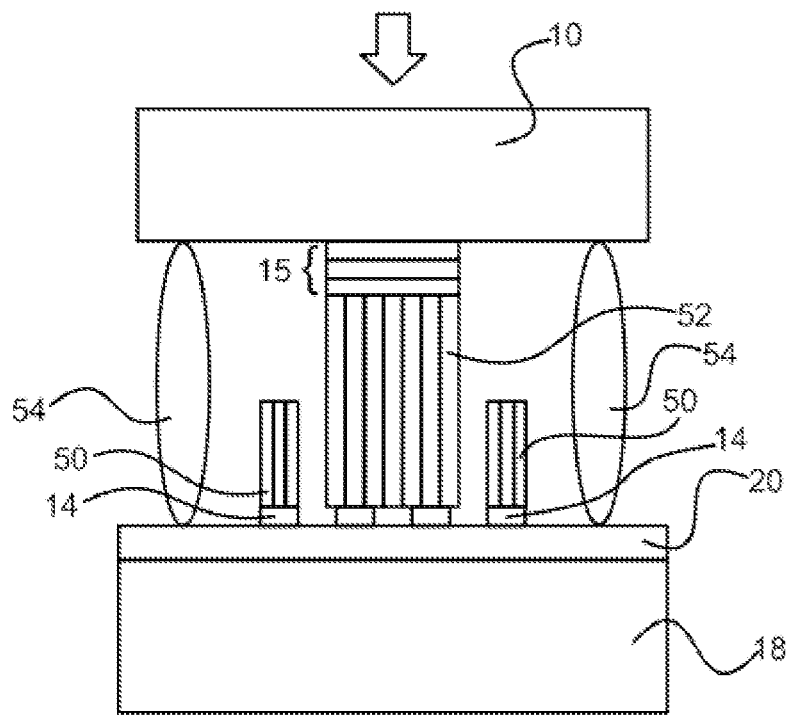
FIG. 5 is a schematic cross-sectional view illustrating a nanostructure transfer method for nanostructures of different heights in accordance with another embodiment of the present invention.

Referring now to FIG. 5, a nanostructure transfer method for nanostructures 50 and 52 of different heights is shown. The nanostructure transfer method of the present embodiment is similar to that described above and a solder material 14 is similarly deposited on a surface of the nanostructures 50 and 52 of different heights. The nanostructures 50 and 52 are then transferred in a sequence of increasing heights, that is, from a lower height to a higher height. More particularly and as can be seen from FIG. 5, the nanostructures 50 with the lower height are first transferred to the second or target substrate 18. Thereafter, the nanostructures 52 with the higher height are then transferred to the second or target substrate 18.

To prevent suppression of the transferred nanostructures 50 during the bonding process, a plurality of spacers 54 may be provided on the second or target substrate 18 prior to bonding the solder material 14 on the nanostructures 52 to the first metal layer 20. The spacers 54 may be made of silicon dioxide ($SiO_2$) or plastic beads and may be of a similar height to the nanostructures 52 being transferred. In one embodiment, the spacers 54 may be sprayed at an edge of the second or target substrate 18. The spacers 54 also help to align and support the nanostructures 52 being transferred during the bonding process.

Advantageously, because the solder material 14 is deposited on a surface of the nanostructures 50 and 52 of different heights, only the solder material 14 on the nanostructures 50 or 52 being transferred are melted during a transfer process. The solder material 14 is therefore not subjected to repeated heating and solidification prior to transfer as only the solder material 14 on the nanostructures 50 or 52 to be transferred is heated. This effectively prevents surface oxidation of the solder material 14 prior to transfer and thus ensures success of each transfer of the nanostructures 50 and 52 of different heights.

The nanostructures 50 and 52 of the present embodiment may be one-dimensional nanostructures. Advantageously, this, and because the thickness of the solder material 14 is only several hundred nanometres, allows the transferred nanostructures 50 to exert a capillary effect on the solder material 14 deposited thereon that are subjected to repeated melting and solidification cycles, thereby significantly reducing reflow problems.

Reflow issues are thus avoided even though the same solder material is used in the described nanostructure transfer method for the nanostructures 50 and 52 of different heights. This makes the method feasible for transferring nanostructures of different heights using the same solder material.

Although nanostructures of two (2) different heights are illustrated in this embodiment, it should be understood by persons of ordinary skill in the art that the present invention is not limited by the number of different heights of nanostructures to be transferred and may be applied to transfer nanostructures with a greater number of different heights.

Figure 6:
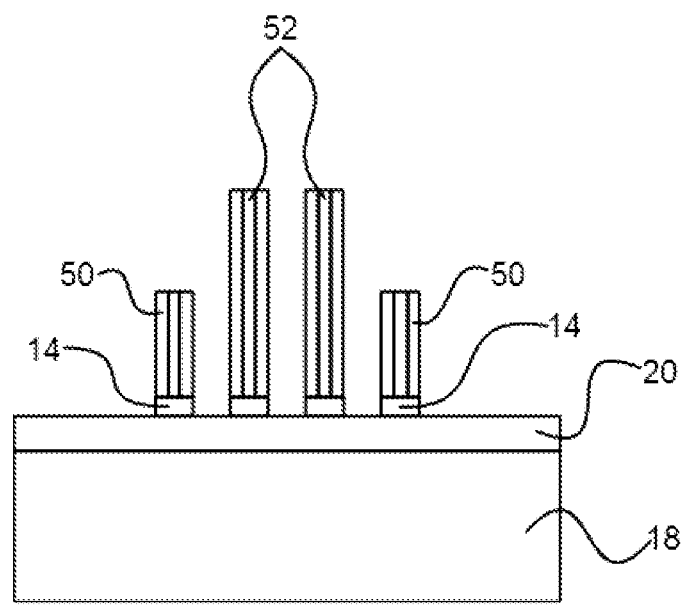
FIG. 6 is a schematic cross-sectional view of nanostructures of different heights transferred in accordance with an embodiment of the present invention.

Referring now to FIG. 6, the attached nanostructures 52 are then mechanically released from the first substrate 10 as shown and in this manner, the nanostructures 50 and 52 of different heights are thus transferred onto the second or target substrate 18.

With reference to FIGS. 7A through 7E, a nanostructure transfer method in accordance with another embodiment will now be described. The present embodiment differs from the earlier embodiments in that a plurality of horizontally aligned nanostructures 70 are being transferred in this embodiment. More particularly, the nanostructures 70 are aligned in a direction parallel to a plane of the substrate. The transfer process for the horizontally aligned nanostructures 70 is similar to that for the vertically aligned nanostructures 12 in the earlier embodiments. Like references are used to indicate similar elements in the earlier embodiments and these are not described again in detail to avoid unnecessary repetition.

Figure 7A:
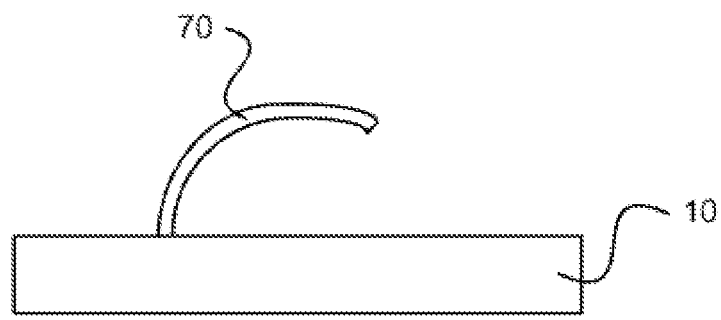
FIGS. 7A through 7E are schematic cross-sectional views illustrating a nanostructure transfer method in accordance with another embodiment of the present invention.

Referring first to FIG. 7A, the nanostructures 70 are grown on the first substrate 10, the nanostructures 70 being bent in a direction parallel to a plane of the first substrate 10.

The bent nanostructures 70 may be grown on the first substrate 10 towards a horizontal direction by adjusting a catalyst that is used in growing the nanostructures 70. More particularly, the catalyst may be adjusted by varying a thickness of the catalyst in the horizontal direction as growth speed of the nanostructures 70 varies with the thickness of the catalyst. Consequently, the nanostructures 70 may be grown bent and in the direction parallel to the plane of the first substrate 10 when the thickness of the catalyst is varied during a growth process of the nanostructures 70.

Figure 7B:
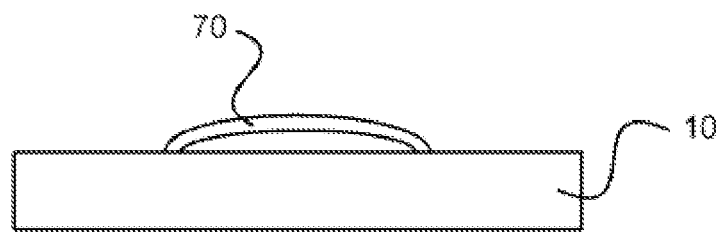

Referring next to FIG. 7B, the nanostructures 70 may then be pressed to align the nanostructures 70 to the plane of the first substrate, thereby forming the horizontally aligned nanostructures 70 on the first substrate 10. The pressing may be performed by mechanical means.

In an alternative embodiment, the horizontally aligned nanostructures 70 may be formed on the first substrate 10 by rolling the vertically aligned nanostructures 12 with a wheel.

Figure 7C:
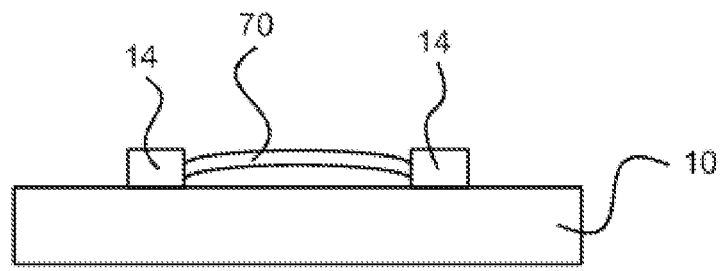

Referring now to FIG. 7C, the solder material 14 may be deposited on both the distal ends and proximal ends of the nanostructures 70 as shown. Although illustrated as having been deposited on both the distal ends and the proximal ends of the nanostructures 70, it should be understood that the present invention is not so limited. In an alternative embodiment, the solder material 14 may be deposited on only one (1) of the two (2) ends of the horizontally aligned nanostructures 70.

Figure 7D:
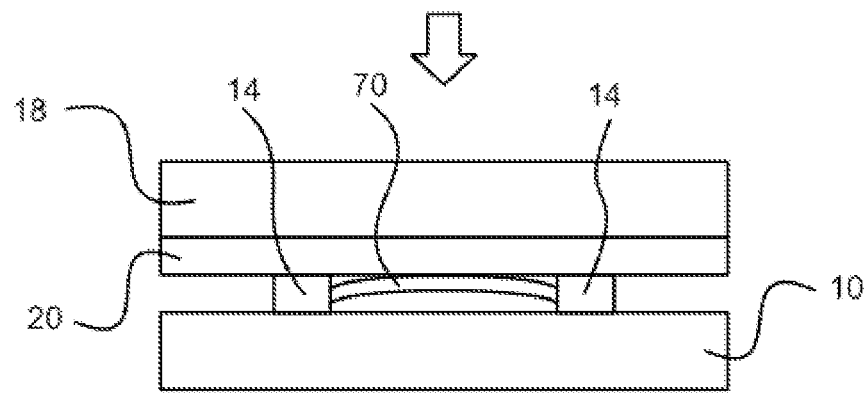

Referring now to FIG. 7D, the second or target substrate 18 having thereon the first metal layer 20 is then provided and brought into contact with the solder material 14 to bond the solder material 14 to the first metal layer 20 using a combination of heat and pressure, thereby attaching the nanostructures 70 to the second substrate 18.

Figure 7E:
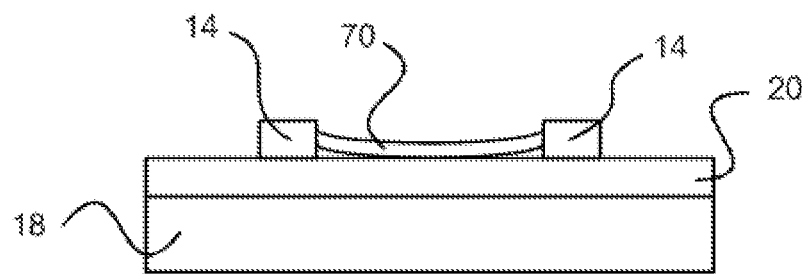

Referring now to FIG. 7E, the attached nanostructures 70 are then released from the first substrate 10. This may be by applying a force to mechanically release the second substrate 18 with the nanostructures 70 attached thereon. The horizontally aligned nanostructures 70 are thus transferred to the second or target substrate 18 as shown.

EXAMPLES

Figure 8A:
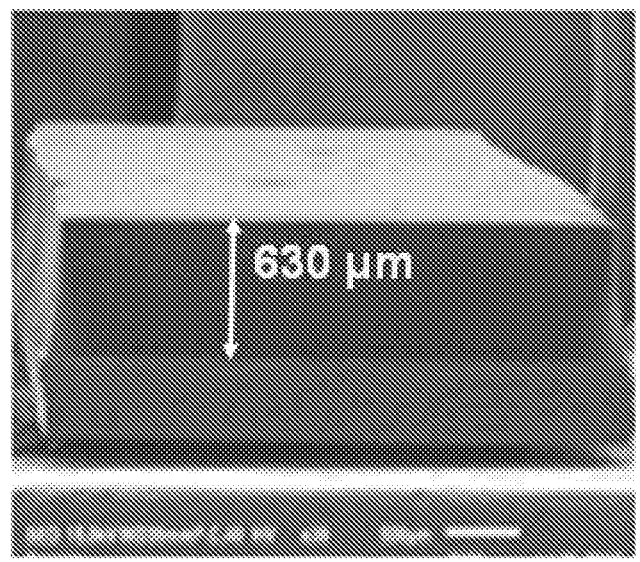
FIG. 8A is an image of carbon nanotubes (CNTs) directly grown on a silicon substrate in accordance with an embodiment of the present invention.
Figure 8B:
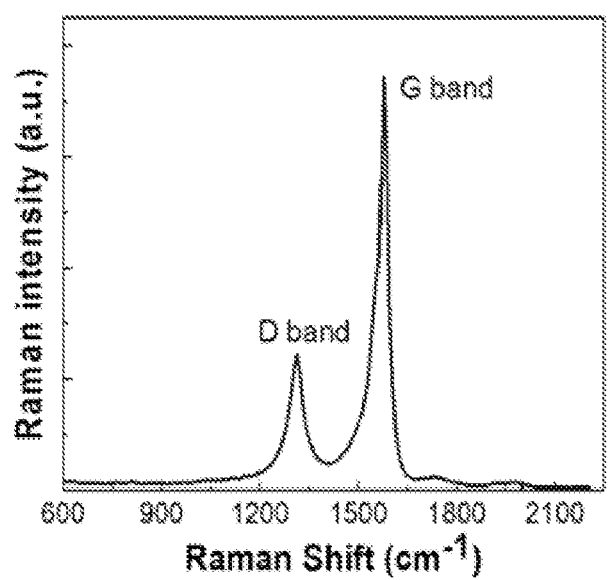
FIG. 8B shows a Raman spectrum of the CNTs of FIG. 8A.

Referring now to FIGS. 8A and 8B, carbon nanotubes with different heights were grown by adjusting growth time.

The carbon nanotubes were directly grown on a silicon (Si) substrate. FIG. 8A shows the carbon nanotubes grown after 15 min by thermal chemical vapour deposition (TCVD) mode using an Aixtron Black Magic CVD system. The height of the carbon nanotubes is about 630 μm after 15 min. FIG. 8B shows the Raman spectrum of the carbon nanotube arrays of FIG. 8A and demonstrate the high quality of the carbon nanotubes grown. This mode may also be used for fabrication of vertical carbon nanotube arrays with preferred aspect ratios, densities and morphologies for the described nanostructure transfer method.

Figure 9A:
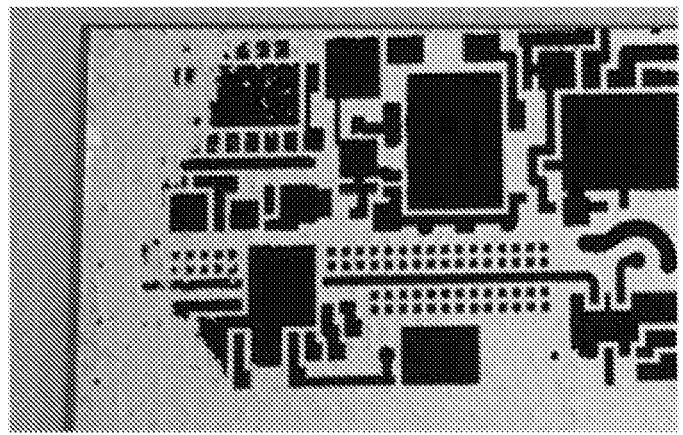
FIG. 9A is a photograph showing CNTs transferred onto a printed circuit board (PCB) in accordance with an embodiment of the present invention.
Figure 9B:
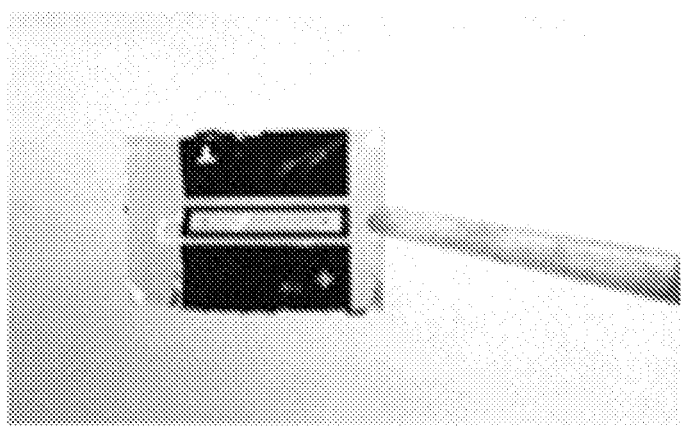
FIG. 9B is a photograph showing CNTs transferred onto a polyethylene terephthalate (PET) substrate in accordance with another embodiment of the present invention.

Referring now to FIGS. 9A and 9B, the nanostructure transfer method was used to transfer carbon nanotubes to a target substrate at low temperatures (typically less than 220° C.). FIG. 9A shows carbon nanotubes transferred onto a print circuit board (PCB) substrate using a tin/silver/copper (Sn/Ag/Cu) alloy as the solder material. As can be seen from FIG. 9A, the carbon nanotubes are selectively transferred onto a gold (Au) surface on the PCB substrate. The transfer area in the embodiment shown is about 6 cm$^2$, corresponding to a transfer area of a flip-chip bonder. This also demonstrates that the described nanostructure transfer method is an add-on technique and does not require any additional layer deposition process to be applied to the target substrate. FIG. 9B shows a carbon nanotube structure transferred onto a polyethylene terephthalate (PET) substrate. As the PET substrate is only able to resist temperatures less than 120° C., an indium/tin (In50/Sn50) alloy was used as the solder material because indium/tin (In/Sn) alloys have melting points as low as 110° C.

Figure 10A:
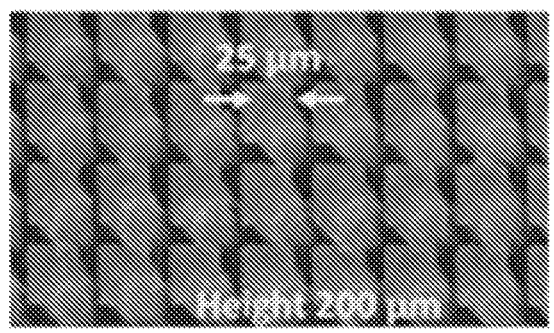
FIGS. 10A through 10D are scanning electron microscopy (SEM) images of transferred nanostructures in accordance with embodiments of the present invention.
Figure 10B:
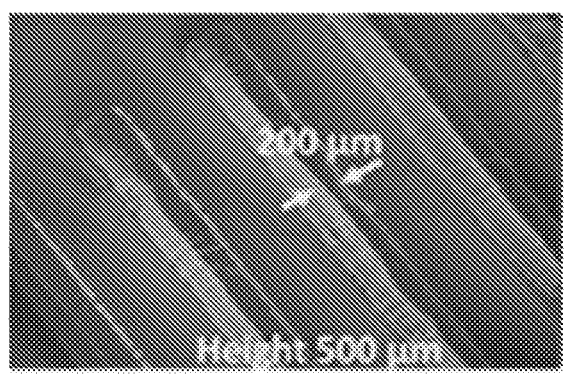
Figure 10C:
Figure 10D:
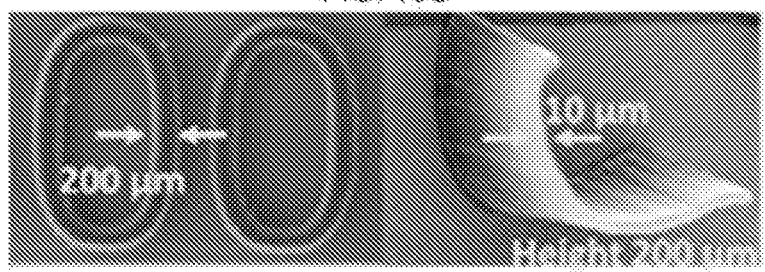

Referring now to FIGS. 10A through 10D, carbon nanotubes with different shapes were also transferred using tin/silver/copper (Sn/Ag/Cu) as solder material and at an operating temperature of less than 220° C. FIG. 10A is a scanning electron microscopy (SEM) image of carbon nanotubes in a periodic arrangement with each element having a length of 25 μm, a width of 25 μm and a height of 200 μm. The pitch between each of the elements is about 20 μm. As can be seen from FIG. 10A, the carbon nanotubes are precisely transferred into position and form a two-dimensional (2D) periodic carbon nanotube pattern. This demonstrates good accuracy achieved by the nanostructure transfer method. FIG. 10B shows transfer of ordered carbon nanotube walls with a height of about 500 μm and a wall thickness of about 200 μm. FIGS. 10C and 10D demonstrate that the nanostructure transfer method may also be used to transfer carbon nanotube arrays shaped as letters and numbers with aspect ratios of over 20 and with curved structures having a wall thickness of as thin as 10 μm. These examples demonstrate that the nanostructure transfer method is both versatile and reliable in transferring multi-shaped and multi-sized carbon nanotubes at low temperatures.

Referring now to FIGS. 11A through 11E, the nanostructure transfer method was also used to transfer carbon nanotubes of different heights onto individual substrates. FIGS. 11A and 11B show carbon nanotubes with heights of 100 μm and 200 μm transferred onto a substrate at different locations. The carbon nanotubes with a height of 100 μm were first transferred and followed by the carbon nanotubes with a height of 200 μm. In both cases, an indium-based metal solder was used. FIGS. 11C and 11D are SEM images of carbon nanotubes of different heights transferred onto the same substrate using tin/silver/copper (Sn/Ag/Cu) as the solder material. As can be seen from FIGS. 11C and 11D, the carbon nanotubes with the two different heights were accurately transferred into position such that the carbon nanotubes of different heights are connected to one another without any gap in between. FIG. 11E shows two sets of patterned carbon nanotubes of different heights transferred onto an area of a substrate. These SEM images demonstrate that the nanostructure transfer method may be used to transfer carbon nanotubes with different heights in a controllable and accurate way.

Figure 12:
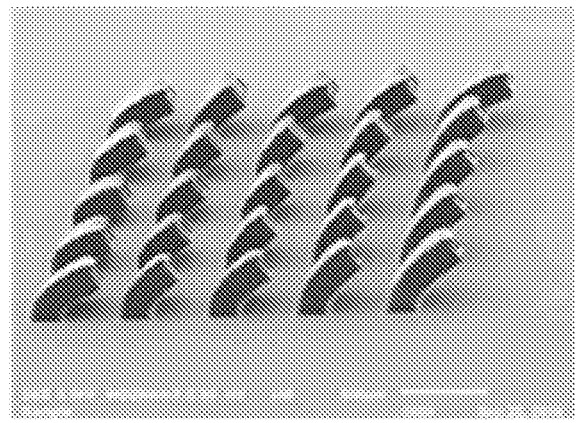
FIG. 12 is a scanning electron microscopy (SEM) image of nanostructures grown on a substrate in accordance with one embodiment of the present invention.

Referring now to FIG. 12, carbon nanotubes bent towards a horizontal direction were also grown as shown by adjusting the catalyst. These may be used in a process for transferring horizontally aligned nanostructures.

Figure 13A:
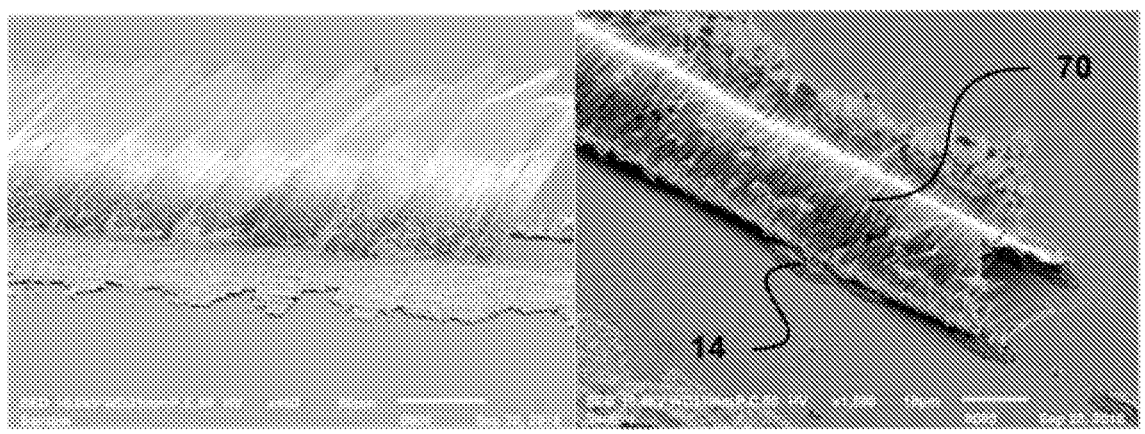
FIGS. 13A through 13C are scanning electron microscopy (SEM) images of transferred nanostructures in accordance with embodiments of the present invention.
Figure 13B:
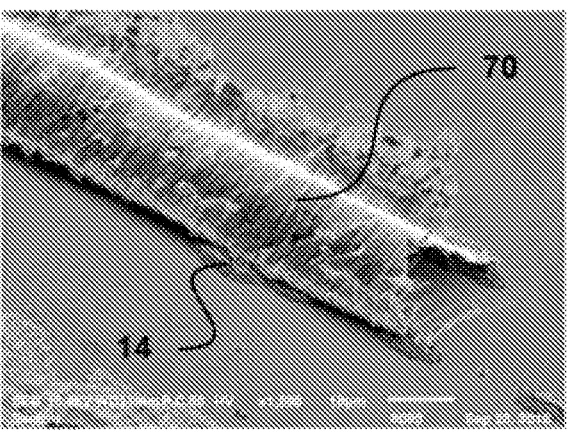
Figure 13C:
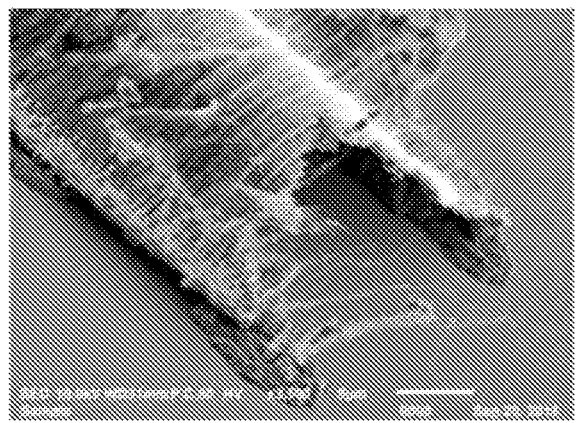

Referring now to FIGS. 13A through 13C, the nanostructure transfer method was also used to transfer carbon nanotubes aligned in a horizontal direction. FIG. 13A shows horizontally aligned carbon nanotubes with one (1) end transferred onto a substrate. FIGS. 13B and 13C are further examples showing both ends of aligned carbon nanotubes bonded to a substrate in a direction parallel to the substrate, the horizontally aligned carbon nanotubes forming an enclosed space with the substrate. FIGS. 13A through 13C demonstrate that the nanostructure transfer method may not only be used to transfer carbon nanotubes in a vertical direction, but also in a horizontal direction and that this may be used to form an enclosed space with aligned carbon nanotubes.

As is evident from the foregoing discussion, the present invention provides a simple and reliable nanostructure transfer method. By requiring deposition of only one solder material, production cost and processing time may be reduced, resulting in a more cost-effective process. Additionally, the usage of only one solder material is also beneficial to achieving controlled electrical properties of devices and circuits which are crucial for industrial production. Further advantageously, the nanostructure transfer method of the present invention is implemented in an add-on way and does not require any additional steps of layer deposition on existing metal surfaces of target devices. The nanostructure transfer method of the present invention enables the transfer of geometrically complex arrays of nanostructures of different heights and minute dimensions onto a single substrate, providing greater design flexibility. Further advantageously, the nanostructure transfer method of the present invention is able to accurately transfer aligned nanostructures to a target substrate without degrading the thermal and electrical performance of the nanostructures.

The nanostructure transfer method of the present invention may be used in complementary metal-oxide-semiconductor (CMOS) processes and may be applied in the fabrication of various radio-frequency and high frequency devices such as waveguides, filters, electromagnetic (EM) shields and antennas as well as interconnects for three-dimensional/heterogeneous integration.

While preferred embodiments of the invention have been illustrated and described, it will be clear that the invention is not limited to the described embodiments only. Numerous modifications, changes, variations, substitutions and equivalents will be apparent to those skilled in the art without departing from the scope of the invention as described in the claims.

Further, unless the context clearly requires otherwise, throughout the description and the claims, the words "comprise", "comprising" and the like are to be construed in an inclusive as opposed to an exclusive or exhaustive sense; that is to say, in the sense of "including, but not limited to".

The invention claimed is:

1. A nanostructure transfer method, comprising:
providing a plurality of first nanostructures, and a plurality of second nanostructures, the first nanostructures and the second nanostructures extending to a respective first height and second height, the second height being greater than the first height;

depositing a solder material on distal ends of the first nanostructures;

providing a target substrate having thereon a first metal layer;

bonding the solder material on the distal ends of the first nanostructures to the first metal layer, thereby attaching the first nanostructures to the target substrate;

depositing a solder material on the distal ends of the second nanostructures;

bonding the solder material on the distal ends of the second nanostructures to the first metal layer, thereby attaching the second nanostructures to the target substrate;

wherein the first and second nanostructures are transferred in a sequence of increasing height, and, wherein the first nanostructures and the second nanostructures are one-dimensional nanostructures.

2. The nanostructure transfer method of claim 1, wherein the first nanostructures and/or the second nanostructures are arranged in a patterned array.

3. The nanostructure transfer method of claim 2, wherein depositing the solder material comprises depositing the solder material in a pattern, using a hard shadow mask, on a surface of the first nanostructures and/or the second nanostructures.

4. The nanostructure transfer method of claim 1, wherein each of the first nanostructures and each of the second nanostructures has a height or length of from about 10 microns (μm) to about 1 millimetre (mm).

5. The nanostructure transfer method of claim 1, further comprising depositing a second metal layer on the distal ends of the first nanostructures and/or the second nanostructures prior to respective depositing of the solder material on the distal ends of the first nanostructures and/or the second nanostructures.

6. The nanostructure transfer method of claim 5, wherein the second metal layer is selected from a group consisting of titanium (Ti), nickel (Ni), palladium (Pd) and chromium (Cr).

7. The nanostructure transfer method of claim 1, wherein the solder material has a melting point of less than 220 degrees Celsius (° C.).

8. The nanostructure transfer method of claim 7, wherein the melting point of the solder material is less than 200° C.

9. The nanostructure transfer method of claim 1, wherein the solder material is selected from a group consisting of indium (In), tin (Sn), zinc (Zn) and an alloy thereof.

10. The nanostructure transfer method of claim 1, wherein the solder material is deposited to a thickness of from about 200 nanometres (nm) to about 600 nm.

11. The nanostructure transfer method of claim 1, wherein the first metal layer is patterned.

12. The nanostructure transfer method of claim 1, wherein the first metal layer has a thickness of from about 50 nm to about 5 μm.

13. The nanostructure transfer method of claim 1, wherein the first metal layer is selected from a group consisting of gold (Au) and silver (Ag).

14. The nanostructure transfer method of claim 1, wherein the step of bonding the solder material to the first metal layer comprises melting the solder material.

15. The nanostructure transfer method of claim 1, wherein the step of bonding the solder material to the first metal layer further comprises applying a force to bond the solder material to the first metal layer.

16. The nanostructure transfer method of claim 1, further comprising providing a plurality of spacers on the target substrate prior to bonding the solder material on the distal ends of the first nanostructures and/or the second nanostructures to the first metal layer.

17. The nanostructure transfer method of claim 1, wherein the attached first nanostructures have a collective width of from about 5 microns (μm) to about centimetres (cm).

18. The nanostructure transfer method of claim 2, wherein the first nanostructures are aligned in a direction parallel to a plane of the first substrate.

19. The nanostructure transfer method of claim 18, further comprising growing the first nanostructures on the first substrate, wherein the first nanostructures are bent in the direction parallel to the plane of the first substrate.

20. The nanostructure transfer method of claim 19, further comprising pressing the first nanostructures to align the nanostructures to the plane of the first substrate.

21. The nanostructure transfer method of claim 18, further comprising depositing the solder material on proximal ends of the first nanostructures.

22. The nanostructure transfer method of claim 1, further comprising providing a plurality of spacers on the target substrate after attaching the first nanostructures, wherein the plurality of spacers extend to a height greater than the first height.

* * * * *